United States Patent
Perroni et al.

(10) Patent No.: US 11,756,614 B2
(45) Date of Patent: *Sep. 12, 2023

(54) PHASE CHANGE MEMORY DEVICE, SYSTEM INCLUDING THE MEMORY DEVICE, AND METHOD FOR OPERATING THE MEMORY DEVICE

(71) Applicant: STMicroelectronics S.r.l., Agrate Brianza (IT)

(72) Inventors: Maurizio Francesco Perroni, Messina (IT); Fabio Enrico Carlo Disegni, Spino d'adda (IT); Davide Manfré, Pandino (IT); Cesare Torti, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,861

(22) Filed: Apr. 4, 2022

(65) Prior Publication Data
US 2022/0230682 A1    Jul. 21, 2022

Related U.S. Application Data

(63) Continuation of application No. 17/119,979, filed on Dec. 11, 2020, now Pat. No. 11,328,768.

(30) Foreign Application Priority Data

Dec. 17, 2019   (IT) .................. 102019000024253

(51) Int. Cl.
*G11C 11/00* (2006.01)
*G11C 13/00* (2006.01)
(Continued)

(52) U.S. Cl.
CPC ........... *G11C 13/0004* (2013.01); *G11C 7/02* (2013.01); *G11C 7/06* (2013.01); *G11C 13/004* (2013.01);
(Continued)

(58) Field of Classification Search
CPC ........ G11C 13/0004; G11C 7/02; G11C 7/06; G11C 13/0026; G11C 13/0028;
(Continued)

(56) References Cited

U.S. PATENT DOCUMENTS 10,593,410 B2   3/2020  Paolino et al.
11,328,768 B2 * 5/2022  Perroni ................ G11C 13/004
(Continued)

FOREIGN PATENT DOCUMENTS

EP    3509065 A1    7/2019
EP    3544013 A1    9/2019

*Primary Examiner* — Hien N Nguyen
(74) *Attorney, Agent, or Firm* — Slater Matsil, LLP (57) ABSTRACT

A phase-change memory device column decoder is divided into two portions that can be governed independently of one another, and the driving signals of the two portions are configured so as to guarantee comparable capacitive loads at the two inputs of a sense amplifier in both of the operations of single-ended reading and double-ended reading. In particular, during single-ended reading, the sense amplifier has a first input that receives a capacitive load corresponding to the direct memory cell selected, and a second input that receives a capacitive load associated to a non-selected complementary memory cell.

20 Claims, 7 Drawing Sheets

(51) Int. Cl.
  *G11C 7/02*  (2006.01)
  *G11C 7/06*  (2006.01)

(52) U.S. Cl.
  CPC ...... *G11C 13/0026* (2013.01); *G11C 13/0028* (2013.01); *G11C 13/0069* (2013.01)

(58) Field of Classification Search
  CPC .............. G11C 13/004; G11C 13/0069; G11C 2013/0042; G11C 2013/0054; G11C 2213/79; G11C 2013/0045
  See application file for complete search history.

(56) References Cited

U.S. PATENT DOCUMENTS

| | | |
|---|---|---|
| 2006/0083064 A1 | 4/2006 | Edahiro et al. |
| 2010/0195415 A1 | 8/2010 | Seko |
| 2011/0058135 A1 | 3/2011 | Misaki |
| 2013/0279237 A1 | 10/2013 | Huang et al. |
| 2014/0078822 A1 | 3/2014 | Di Vincenzo et al. |

\* cited by examiner

PHASE CHANGE MEMORY DEVICE, SYSTEM INCLUDING THE MEMORY DEVICE, AND METHOD FOR OPERATING THE MEMORY DEVICE

CROSS-REFERENCE TO RELATED APPLICATIONS

This application is a continuation of U.S. patent application Ser. No. 17/119,979, filed Dec. 11, 2020, which application claims the benefit of Italian Application No. 102019000024253, filed on Dec. 17, 2019, which applications are hereby incorporated herein by reference.

TECHNICAL FIELD

The present invention relates to a phase-change memory device, to a system that includes the phase-change memory device, and to a method for operating the phase-change memory device.

BACKGROUND

Non-volatile phase-change memories (PCMs) are known, in which for storing information the characteristics of materials that present the property of switching between phases that have different electrical characteristics are exploited. For instance, such materials are able to switch between a disorderly, amorphous phase and an orderly, crystalline or polycrystalline phase, and the two phases are associated with resistivities having considerably different values, and consequently with different values of a datum stored. For instance, the elements of Group VI of the Periodic Table, such as tellurium (Te), selenium (Se), or antimony (Sb), referred to as chalcogenides or chalcogenic materials, may advantageously be used for the production of phase-change memory cells. Phase-changes are obtained by locally increasing the temperature of the cells of chalcogenic material, through resistive electrodes (generally known as heaters) arranged in contact with respective regions of chalcogenic material. Selection devices (for example, MOSFETs) are connected to the heaters and enable passage of an electric programming current through a respective heater. The electric current, by the Joule effect, generates the temperatures necessary for phase-change. During reading, the state of the chalcogenic material is detected by applying a voltage that is sufficiently low as not to cause a considerable heating, and then by reading the value of the current that flows in the cell. Given that the current is proportional to the conductivity of the chalcogenic material, it is possible to determine in which state the material is, and therefore to arrive at the datum stored in the memory cell.

SUMMARY

In a known way, non-volatile memories comprise an array of memory cells organised in rows (wordlines) and columns (bitlines). Each memory cell is constituted, in the case of PCMs, by a phase-change storage element and a selector transistor, connected in series. A column decoder and a row decoder enable selection, on the basis of address logic signals received at input and more or less complex decoding schemes, of the memory cells, and in particular of the corresponding wordline and bitline each time addressed.

The column decoder comprises a plurality of analog selection switches (implemented by transistors), which receive at their respective control terminals the address signals. The selection switches are organized according to a tree structure in hierarchical levels, and their number in each hierarchical level is linked to the organization and size of the memory array. The selection switches, when enabled, make it possible to bring the bitline selected to a definite value of voltage and/or current, according to the operations that are to be implemented. In particular, a current path is created between a programming stage or a reading stage and the bitline selected. The current path is defined by the series of a certain number of selection switches. In a known way, sense amplifiers carry out reading of the data stored in the memory cells, comparing the current that flows in the memory cell selected (or an electrical quantity correlated thereto) with a reference current that flows in a reference cell (so-called double-ended reading) or else with a reference current supplied by a reference-current generator (so-called single-ended reading). Single-ended reading is typically used during verification that programming of the cell has occurred or during testing, whereas double-ended reading is typically used during normal use of the memory to read the logic datum stored in the cell that is to be read.

To carry out single-ended reading, an input of the sense amplifier receives the current of the memory cell that is to be read, while the other input of the sense amplifier receives the reference current supplied by the reference-current generator.

In both of the modalities referred to it is expedient to guarantee, as far as possible, for the sense amplifier similar working conditions, with particular attention paid to the capacitive load at the two inputs thereof. This need, however, is unlikely to be met in single-ended reading systems in so far as, in a way in itself evident, the capacitance associated to a reference-current generator used in single-ended reading is different from the capacitance that derives from the bitline used for carrying the current signal of the cell that is to be read.

In addition, it may be noted that the effective value of capacitance associated to the bitline is affected by a series of factors that are unforeseeable, such as the manufacturing process spread. Consequently, fluctuations may arise that do not render convenient the use of a pre-set capacitance associated to the reference-current generator.

To overcome these drawbacks, it is known to connect the input of the sense amplifier that receives the reference current also to a de-selected memory cell (i.e., a cell that is turned off), through the respective bitlines. In this way, it is possible to guarantee a comparable capacitive load at the two inputs of the sense amplifier both in the operation of single-ended reading (reading of a logic datum stored in a memory cell by comparison with a current reference) and in the operation of double-ended reading (reading of a logic datum stored in a memory cell by comparison with a further memory cell).

In particular, in the case of single-ended reading of a memory cell selected via the corresponding wordline and coupled to a local bitline of a memory sector, the sense amplifier will have, on a first input thereof, the capacitance associated to the local bitline plus the capacitance associated to a first main bitline to which the local bitline is connected. In addition, the sense amplifier will receive, on a second input thereof, the reference current used for the comparison but also a capacitance associated to a further main bitline, which, during this operation, is decoupled from local bitlines. In other words, the sense amplifier receives capacitive loads of a similar amount on both of the inputs.

Figure 1:
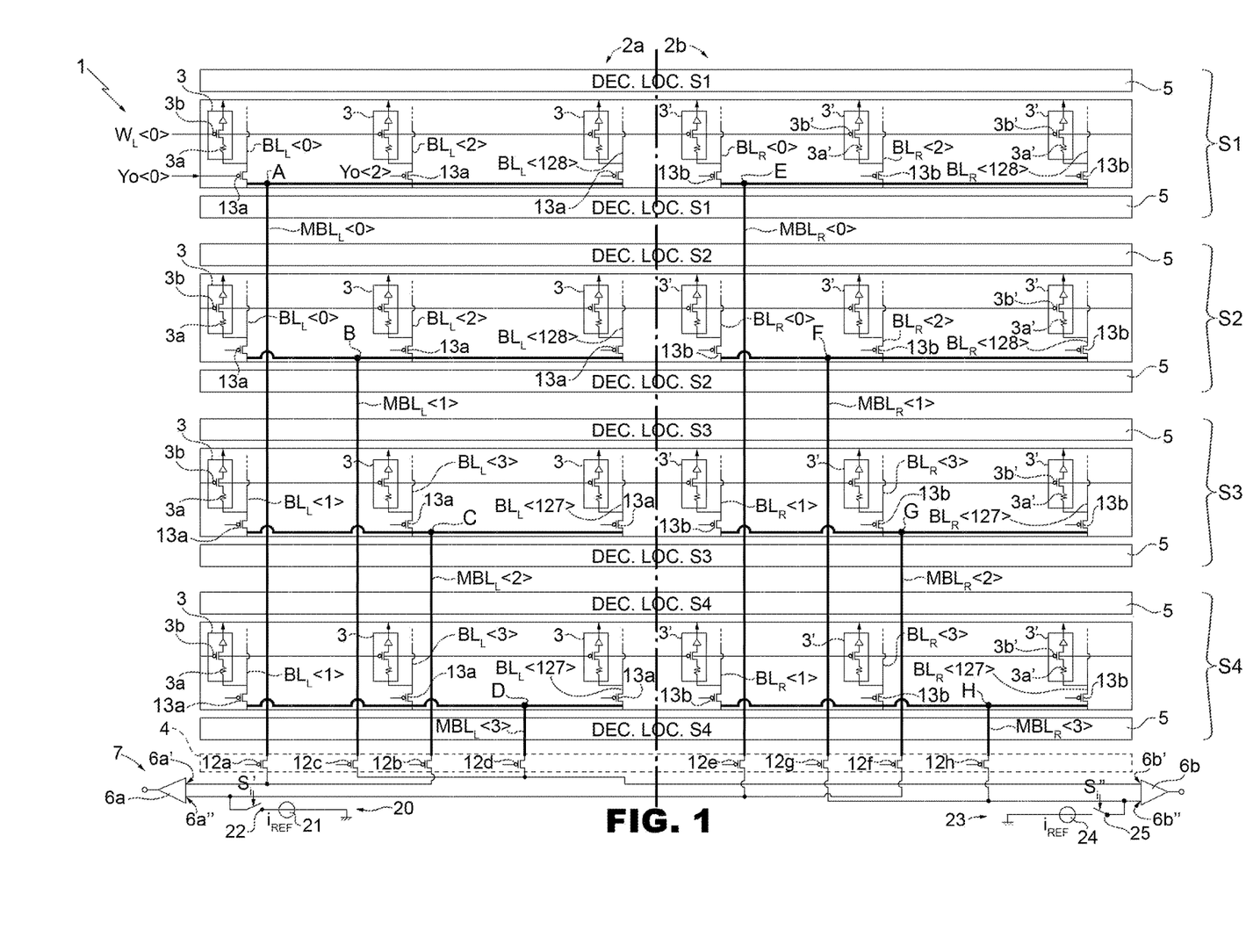
FIG. 1 is a schematic illustration of a portion of a non-volatile memory device, in particular of a PCM type, according to an embodiment that does not form part of the present invention.

Illustrated schematically in FIG. 1 and designated as a whole by the reference number 1 is a portion of a non-volatile memory device, in particular of a PCM type, limitedly to just the parts necessary for an understanding of the present disclosure.

In particular, the non-volatile memory device 1 comprises a memory array 2, constituted by a plurality of first memory cells 3 (each including a phase-change region 3a and a local selection transistor 3b), and by a plurality of second memory cells 3' (each including a phase-change region 3a' and a local selection transistor 3b'), which can be selected by local wordlines WL and local bitlines BL. In a way in itself known, the second memory cells 3' correspond, as regards number and manufacturing characteristics, to the first memory cells 3 and, in use, store a logic datum complementary to that of the first memory cells 3. The second memory cells 3' are queried, during double-ended reading of the first memory cells 3, to read the logic datum stored in the first memory cells 3 by comparison with the logic datum stored in respective second memory cells 3'.

FIG. 1 illustrates first memory cells 3 ("direct" cells) operatively coupled to respective local wordlines WL< > (WL<0>, WL<1>, . . . ) and to respective local bitlines $BL_L$< > ($BL_L$<0>, $BL_L$<1>, . . . ), etc. Likewise shown are second memory cells 3' ("complementary" cells), operatively coupled to the local wordlines WL< >, designated in FIG. 1 as WL<0>, WL<1>, . . . , and to respective local bitlines $BL_R$< >, designated in FIG. 1 as $BL_R$<0>, $BL_R$<1>, . . . , etc.

The local bitlines $BL_L$< > and the first memory cells 3 form a first memory portion 2a. The local bitlines $BL_R$< > and the second memory cells 3' form a second memory portion 2b.

The phase-change element 3a, 3a' includes a phase-change material (for example, a chalcogenide), and is therefore able to store data in the form of levels of resistance associated to the different phases assumed by the phase-change material. The selector element 3b, 3b' is, for example, a PMOS transistor having its gate terminal connected to the respective wordline WL< >, a first conduction terminal connected to the phase-change element, and a second conduction terminal connected to a reference potential (for example, ground). The selector element is controlled so as to enable, when selected (i.e., switched on by the signal of the respective local wordline WL< > to which it is coupled), passage of a reading current through the phase-change element during an operation of reading of the logic datum stored therein.

The non-volatile memory device 1 further comprises a row decoder (here not illustrated), adapted to select the local wordline WL< > corresponding to the memory cell 3, 3' each time to be addressed.

As represented schematically in FIG. 1, the memory array 2 is organized in a plurality of sectors (shown by way of example in the figure are only four sectors S1-S4). Each sector comprises respective local bitlines BL< > (direct bitlines $BL_L$< > and complementary bitlines $BL_R$< >), which can be addressed by a local column decoder 5 dedicated to each sector. The local bitlines BL< > of the sectors S1 and S2 can be addressed by an even number of addresses, and the respective sectors S1 and S2 may in what follows be referred to as "even sectors". The local bitlines BL< > of the sectors S3 and S4 can be addressed by an odd number of addresses, and the respective sectors S3 and S4 may in what follows be referred to as "odd sectors".

Given the matrix structure, activation of a local wordline WL< > and of a local bitline $BL_{L,R}$< > enables unique selection of only one memory cell 3, 3'.

A reading stage 7, of a type in itself known, is provided with a first sense amplifier 6a and a second sense amplifier 6b. The presence of two sense amplifiers 6a, 6b is dictated by the particular organization of the memory 1 where, to increase the reading speed, simultaneous reading of data different from one another is carried out (according to the even and odd division, mentioned previously and illustrated more fully hereinafter) by the two amplifiers 6a, 6b.

The reading stage 7 is coupled to the local bitlines $BL_{L,R}$< > by main bitlines $MBL_L$< > (in the portion 2a) and main bitlines $MBL_R$< > (in the portion 2b).

A global column decoder 4 is adapted to select the main bitline to which the memory cell 3, 3' to be addressed is coupled. The global column decoder 4 comprises, in an embodiment provided by way of example: a plurality of main selection switches 12a-12d coupled to main bitlines $MBL_L$< > of the memory portion 2a; and a plurality of main selection switches 12e-12h coupled to main bitlines $MBL_R$< > of the memory portion 2b.

A first main bitline $MBL_L$<0>, belonging to the memory portion 2a, connects the local bitlines $BL_L$< > of the first sector S1 to the global column decoder 4 and, via the latter, to the reading stage 7. In detail, the first main bitline $MBL_L$<0> extends between a terminal of the main selection switch 12a and a node A common to all the local bitlines $BL_L$< > belonging to the sector S1 in the first memory portion 2a (direct cells). The other terminal of the main selection switch 12a is coupled to a first input 6a' of the sense amplifier 6a.

A second main bitline $MBL_L$<1>, belonging to the memory portion 2a, connects the local bitlines $BL_L$< > of the second sector S2 to the global column decoder 4 and, via the latter, to the reading stage 7. In detail, the second main bitline $MBL_L$<1> extends between a terminal of the main selection switch 12b and a node B common to all the local bitlines $BL_L$< > belonging to the sector S2 in the first memory portion 2a (direct cells). The other terminal of the main selection switch 12b is coupled to the first input 6a' of the sense amplifier 6a.

A third main bitline $MBL_L$<2>, belonging to the memory portion 2a, connects the local bitlines $BL_L$< > of the third sector S3 to the global column decoder 4 and, via the latter, to the reading stage 7. In detail, the third main bitline $MBL_L$<2> extends between a terminal of the main selection switch 12c and a node C common to all the local bitlines $BL_L$< > belonging to the sector S3 in the first memory portion 2a (direct cells). The other terminal of the main selection switch 12c is coupled to a first input 6b' of the sense amplifier 6b.

A fourth main bitline $MBL_L$<3>, belonging to the memory portion 2a, connects the local bitlines $BL_L$< > of the fourth sector S4 to the global column decoder 4 and, via the latter, to the reading stage 7. In detail, the fourth main bitline $MBL_L$<3> extends between a terminal of the main selection switch 12d and a node D common to all the local bitlines $BL_L$< > belonging to the sector S4 in the first memory portion 2a (direct cells). The other terminal of the main selection switch 12d is coupled to the first input 6b' of the sense amplifier 6b.

The memory portion 2b (complementary cells) is organized in a way similar to the memory portion 2a of the direct cells, as described hereinafter.

There is thus present a fifth main bitline $MBL_R$<0>, belonging to the memory portion 2b, which connects the local bitlines $BL_R$< > of the first sector S1 to the global column decoder 4 and, via the latter, to the reading stage 7. In detail, the fifth main bitline $MBL_R$<0> extends between a terminal of the main selection switch 12e and a node E common to all the local bitlines $BL_R$< > belonging to the sector S1 in the second memory portion 2b (complementary cells). The other terminal of the main selection switch 12e is coupled to a second input 6a" of the sense amplifier 6a.

A sixth main bitline $MBL_R<1>$, belonging to the memory portion 2b, connects the local bitlines $BL_R<>$ of the second sector S2 to the global column decoder 4 and, via the latter, to the reading stage 7. In detail, the sixth main bitline $MBL_R<1>$ extends between a terminal of the main selection switch 12f and a node F common to all the local bitlines $BL_R<>$ belonging to the sector S2 in the second memory portion 2b (complementary cells). The other terminal of the main selection switch 12f is coupled to the second input 6a" of the sense amplifier 6a.

A seventh main bitline $MBL_R<2>$, belonging to the memory portion 2b, connects the local bitlines $BL_R<>$ of the third sector S3 to the global column decoder 4 and, via the latter, to the reading stage 7. In detail, the seventh main bitline $MBL_R<2>$ extends between a terminal of the main selection switch 12g and a node G common to all the local bitlines $BL_R<>$ belonging to the sector S3 in the second memory portion 2b (complementary cells). The other terminal of the main selection switch 12g is coupled to a second input 6b" of the sense amplifier 6b.

An eighth main bitline $MBL_R<3>$, belonging to the memory portion 2b, connects the local bitlines $BL_R<>$ of the fourth sector S4 to the global column decoder 4 and, via the latter, to the reading stage 7. In detail, the fourth main bitline $MBL_L<3>$ extends between a terminal of the main selection switch 12d and a node D common to all the local bitlines $BL_R<>$ belonging to the sector S4 in the first memory portion 2a (direct cells). The other terminal of the main selection switch 12d is coupled to the first input 6b' of the sense amplifier 6b.

Each local bitline $BL_L<>$ of the sector S1 of the first memory portion 2a is electrically coupled to the node A by a respective local selection switch 13a (in the example of FIG. 1, local selection switches 13a are present in the form of PMOS transistors). Likewise, each local bitline $BL_R<>$ of the sector S1 of the second memory portion 2b is electrically coupled to the node E by a respective local selection switch 13b (in this example, PMOS transistors).

Likewise, each local bitline $BL_L<>$ of the sector S2 of the first memory portion 2a is electrically coupled to the node B by a respective local selection switch 13a (in the example of FIG. 1, local selection switches 13a are present in the form of PMOS transistors). Likewise, each local bitline $BL_R<>$ of the sector S2 of the second memory portion 2b is electrically coupled to the node F by a respective local selection switch 13b (in this example, PMOS transistors).

The same structure is replicated in a similar way, and not described any further herein, for the remaining local bitlines $BL_{L,R}<>$ of the sectors S3 and S4.

The local selection switches 13a, 13b form part of the respective local column decoders 5.

During use, the local column decoder 5 receives at input address-selection signals (also known as Decoded Address Signals, or DASs) $S_{YO}<>$ (in particular, $S_{YO}<0>$, ..., $S_{YO}<1>$, ...) for selecting a respective local bitline $BL_L<>$ ($BL_L<0>$, $BL_L<1>$, ...) and/or $BL_R<>$ ($BL_R<0>$, $BL_R<1>$, ...) in order to access the first memory cells 3 and/or the second memory cells 3'.

The signals $S_{YO}<>$ are low-voltage signals, i.e., operating in the range of logic voltages [GND, VDD], where VDD is, for example, comprised between 1V and 1.4 V and GND is a ground reference voltage, for example 0 V.

As mentioned previously, to increase the reading parallelism, the sense amplifier 6a is coupled to a subset of so-called even bitlines $BL<>$ (i.e., indexed by an even index, such as $BL<0>$, $BL<2>$, $BL<4>$, etc.) belonging to the sectors S1, S2, while the sense amplifier 6b is coupled to a subset of so-called odd bitlines $BL<>$ (i.e., indexed by an odd index, such as $BL<1>$, $BL<3>$, $BL<5>$, etc.) belonging to the sectors S3, S4. The reading operation is carried out at the same time by the sense amplifier 6a and 6b for the respective memory cells 3, 3' coupled, respectively, to the even and odd bitlines $BL<>$.

The local column decoder 5 is configured so as to generate a current path between an even direct bitline selected from $BL_L<0>$, $BL_L<2>$, etc. (belonging to the portion 2a) and the first input 6a' of the sense amplifier 6a, and between an even complementary bitline selected from $BL_R<0>$, $BL_R<2>$, etc. (belonging to the portion 2b) and the second input 6a" of the sense amplifier 6a.

Furthermore, the local column decoder 5 is configured so as to generate a current path between an odd direct bitline selected from $BL_L<1>$, $BL_L<3>$, etc. (belonging to the portion 2a) and the first input 6b' of the sense amplifier 6b, and between an odd complementary bitline selected from $BL_R<1>$, $BL_R<3>$, etc. (belonging to the portion 2b) and the second input 6b" of the sense amplifier 6b.

It may be noted that also the organization in sectors S1-S4 takes into account the reading division between even and odd. In fact, the sectors S1 and S2 group together bitlines that can be selected by even addresses, whereas the sectors S3 and S4 group together bitlines that can be selected by odd addresses. The main bitlines $MBL_{L,R}<0,1>$ access even sectors S1 and S2; the main bitlines $MBL_{L,R}<2,3>$ access odd sectors S3 and S4.

In effect, the global column decoder 4 comprises two distinct read-decoding circuits, adapted to generate a respective current path between memory cells 3 of the portion 2a and the respective input 6a', 6b' of the sense amplifiers 6a, 6b, and between second memory cell 3' of the portion 2b and the respective input 6a", 6b" of the sense amplifiers 6a, 6b. The current paths thus generated are completely distinct and separate from one another.

The two aforementioned read-decoding circuits of the global column decoder 4 present a specular circuit structure. The number of selection switches that form the global column decoder 4 depends upon the size of the memory array 2 and/or of the sectors of the memory array 2, as well as upon the hierarchical organization of the column selectors.

The read-decoding circuits of the global column decoder 4 moreover comprise buffers (not illustrated) that drive the selection switches 12a-12h. Each buffer 9a receives a control signal $S_{YN}$ and supplies to the control terminals of the respective selection switches 12a-12h a column-decoding signal YN.

Moreover, a plurality of local buffers (not illustrated) is present. Bitlines $BL_L<>$ belonging to the first portion 2a and corresponding to respective bitlines $BL_R<>$ of the second portion 2b of the memory array 2 (i.e., the bitlines selected by a same signal $S_{YO}<>$) can share a same local buffer. The local buffers are configured to receive a respective control signal $S_{YO}<>$ and supply to the control terminals of the respective local selection switches 13a, 13b column-decoding signals $YO_L<>$, $YO_R<>$.

The selection switches of the circuit of FIG. 1 are implemented by PMOS transistors, which have a control terminal (gate) that receives the respective column-decoding signals YN, $YO_L<>$, $YO_R<>$, which is a logic signal "o" that switches on the respective transistor, or else "1" that switches off the respective transistor. In use, the signals $S_{YO}<>$ and $S_{YN}$ are low-voltage signals, and one of the operations carried out by the buffers is to raise the voltage by generating a voltage signal adequate for driving the respective PMOS transistor.

The non-volatile memory device 1 further comprises a first reference branch 20 including a reference generator 21, configured to generate a reference current $i_{REF}$, electrically coupled to the second input 6a" of the sense amplifier 6a by a selection switch 22. The selection switch 22 is driven by a signal $S_i'$, configured to switch on and switch off the selection switch 22 in respective operating modes of the non-volatile memory device 1 in order to set up or interrupt an electrical path for the reference current $i_{REF}$ towards the second input 6a" of the sense amplifier 6a.

The non-volatile memory device 1 further comprises a second reference branch 23 including a reference generator 24, configured to generate a reference current $i_{REF}$, electrically coupled to the second input 6b" of the sense amplifier 6b by a selection switch 25. The selection switch 25 is driven by a signal $S_i''$, configured to switch on and switch off the selection switch 25 in respective operating modes of the non-volatile memory device 1 in order to set up or interrupt an electrical path for the reference current $i_{REF}$ towards the second input 6b" of the sense amplifier 6b.

During use of the non-volatile memory device 1 in double-ended reading, the reference generators 21, 24 are off. Reading is therefore performed by each sense amplifier 6a, 6b by receiving at the respective inputs a datum (value of voltage/current) stored in a direct cell and a datum stored in a complementary cell. During reading of a datum, the respective (direct and complementary) cells that are being read belong to a same sector S1-S4, but to respective memory portions 2a, 2b. The connections between the memory cells and the sense amplifiers have been described previously.

Conversely, during use of the non-volatile memory device 1 in single-ended reading, the reference generators 21, 24 are on, and reading is performed by comparing the current that flows in the memory cell selected with the reference current $i_{REF}$. In this reading mode, in order to maintain a same (capacitive) load on both of the inputs of the sense amplifiers 6a, 6b, the global column decoder 4 is controlled so as to connect the inputs 6a", 6b" of the sense amplifiers 6a, 6b to a respective main bitline $MBL_R<>$ belonging to the memory portion 2b. In addition, the local column decoder 5 is controlled so as to connect the respective main bitlines $MBL_R<>$ to the local bitlines $BL_R<>$ of the respective memory sectors S1-S4. However, the wordlines $WL<>$ are de-selected so that no specific memory cell 3' is in effect addressed. In this way, the only current that flows at the input 6a", 6b" of the sense amplifiers 6a, 6b is the respective reference current $i_{REF}$. The capacitive load is, instead, given by the sum of the capacitances associated to the respective main and local bitlines that have been connected to the input 6a", 6b" of the sense amplifier 6a, 6b.

Figure 2:
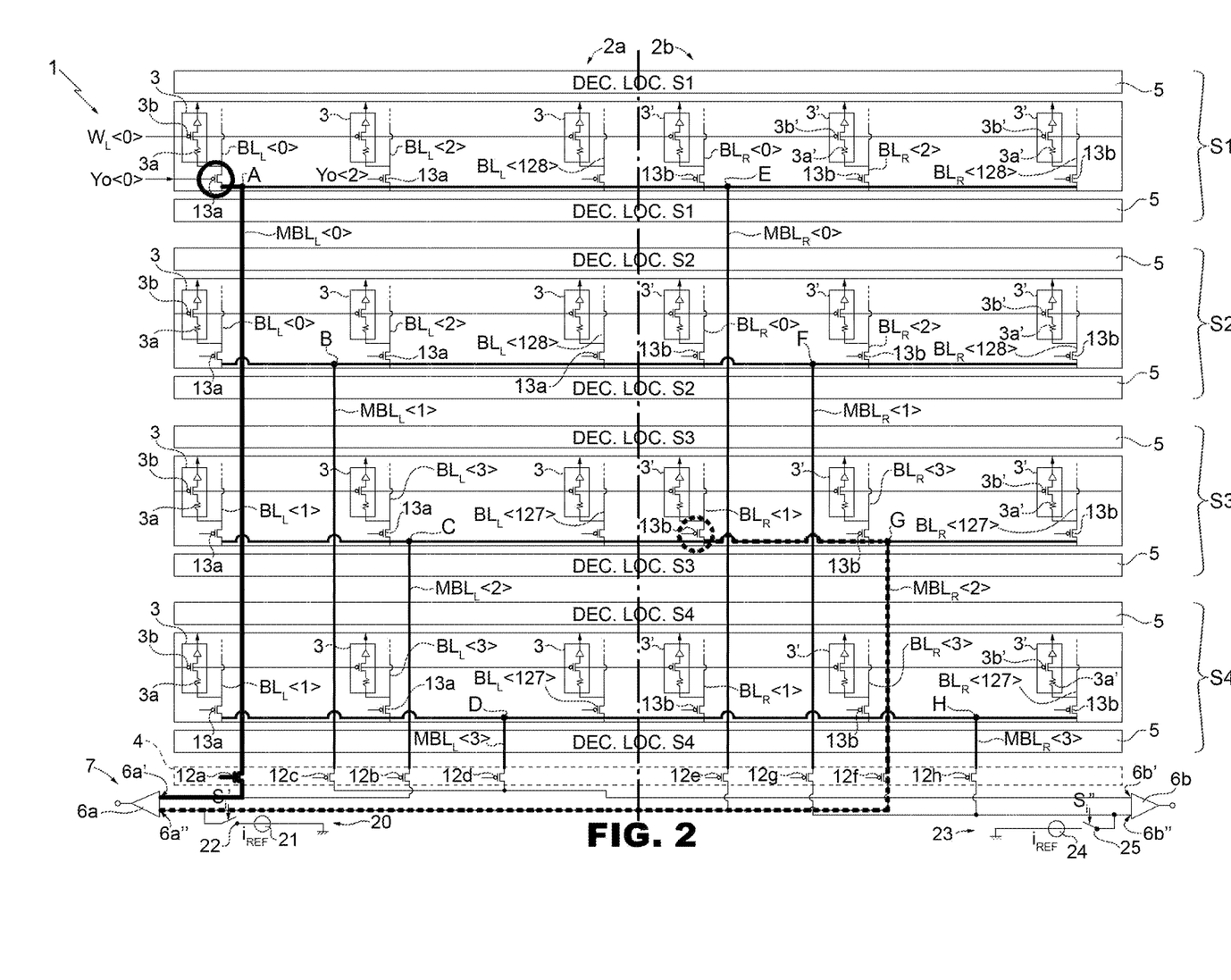
FIG. 2 shows the memory device of FIG. 1 in an operating condition.

To clarify the foregoing more fully, an example is proposed, with reference to FIG. 2.

FIG. 2 corresponds, where not otherwise specified, to FIG. 1.

To read in single-ended mode a direct memory cell belonging to the sector S1, the corresponding local selection switch 13a (delimited by a dashed circle in the sector S1, portion 2a) is switched on and the cell to be read is selected by activating the respective wordline WL (WL<0> in FIG. 2). Therefore, the main selector 12a is switched on, thus connecting the input 6a' of the amplifier 6a to the main bitline $MBL_L<0>$. In this way, an electrical connection is set up between the memory cell 3 to be read and the sense amplifier 6a. As has been said, supplied at the input 6a" is a reference current signal $i_{REF}$. To provide at the input 6a" a capacitive load comparable with the one present at the input 6a', the local selection switch 13b delimited by a dashed circle in the sector S2, portion 2b, is switched on, but no complementary memory cell is selected by the respective wordline $WL<>$ (which remains de-selected). Moreover, the main selector 12f is switched on to connect the main bitline $MBL_R<1>$ to the local bitline $BL_R<>$ selected via the local selection switch that has been switched on. The other selectors 12b-12d, 12e, 12g, 12h remain off. It should be noted that the choice of switching on the selector 12f is dictated by the fact that this selector is coupled to the main bitline $MBL_R<1>$, which is in turn connected to the sector S2, i.e., to the sector physically "closest" to the sector S1 to which the direct memory cell to be read belongs. In this way, since the two memory portions 2a, 2b are specular, we have the best guarantee of having a match that is as accurate as possible between the capacitive loads at the inputs 6a' and 6a". In fact, the capacitance associated to the main bitlines $MBL_{L,R}<>$ depends directly upon the length of the main bitlines $MBL_{L,R}<>$. It may be noted that it would not be possible to connect the main bitline $MBL_R<0>$ to the input 6a" by switching on the selector 12e in so far as the wordline $WL<>$ selected for accessing the memory cell 3 to be read is common to the entire sector S1, both in the portion 2a and in the portion 2b. Consequently, this condition is not practicable in single-ended reading.

A similar situation occurs for the reading performed by the sense amplifier 6b.

The present applicant has found that, to reduce the total area occupied by the memory array 2, it would be expedient to group memory sectors S1, S2, . . . , etc. physically together. For instance, by grouping together the memory sector S2 and the memory sector S1, a new memory sector S1' would be obtained having a size equal to the sum of the sizes of the sectors S1 and S2 prior to grouping. In this way, there would be a saving of area given by the elimination of the local column decoders 5 associated to the sectors that have been eliminated (i.e., grouped together). In this example, the local column decoders 5 dedicated to the sector S2 would be eliminated. The entire new sector S1' would be handled by a local column decoder thereof.

However, grouping together of the sectors S2 and S1 would no longer make it possible, in the single-ended reading mode, to address properly the memory cell 3 to be read and at the same time to guarantee the desired capacitive load at the input 6a" of the sense amplifier 6a that receives the reference current $i_{REF}$ (as for the amplifier 6b). In fact, since it is not possible in this situation to connect the input 6a" with the main bitline $MBL_R<1>$ of the second sector S2 (which has been eliminated), it would be necessary to use a further and different main bitline $MBL_R<>$, losing at least in part the condition of matching of capacitances seen at the inputs of the sense amplifier 6a (likewise 6b). In fact, this grouping of sectors involves the use of a single column decoder for both of the sectors, which would therefore be addressed simultaneously.

Furthermore, by replicating the concept set forth above for all the even sectors and for all the odd sectors (i.e., by creating a single even sector accessible by just one local column decoder and a single odd sector accessible by just one, respective, local column decoder), it would not be possible to implement the strategy described above with reference to FIG. 2, in so far as there would cease to be a de-selected sector to be used in single-ended reading to replicate the capacitive load at the terminal that receives the reference current $i_{REF}$.

The aim of the present invention is consequently to provide a PCM device that will make it possible to solve, either totally or in part, the aforementioned problems, and that will be optimized as regards the characteristics of capacitive load seen by the sense amplifier in both the single-ended reading mode and the double-ended reading mode. The aim of the present invention is likewise to disclose a method for operating the PCM device.

According to the present invention, a phase-change memory device, a system including the phase-change memory device, and a method for operating the phase-change memory device are consequently provided, as defined in the annexed claims.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 3:
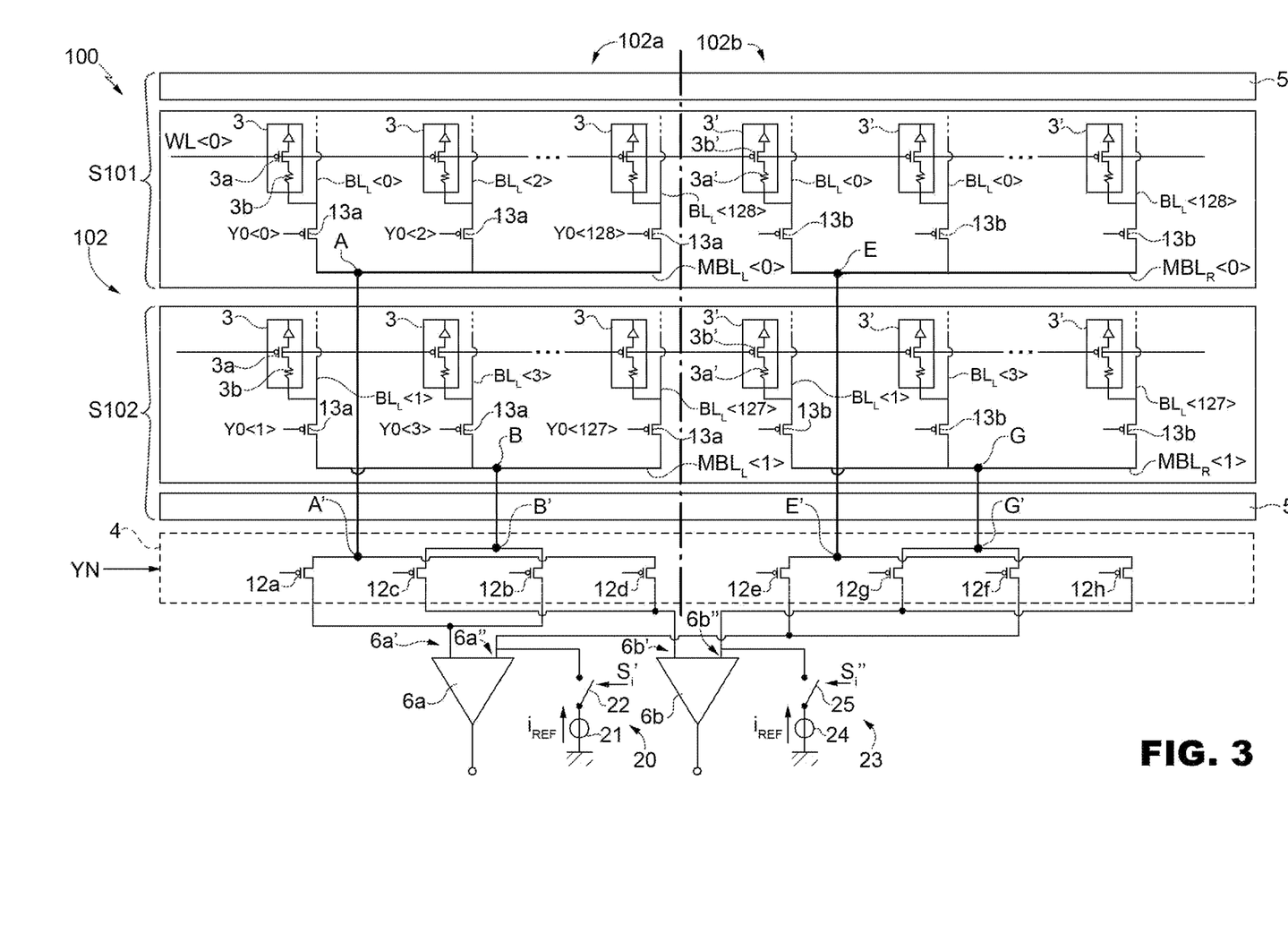
FIG. 3 is a schematic illustration of a portion of a non-volatile memory device, in particular of a PCM type, according to an embodiment of the present invention.

Illustrated schematically in FIG. 3 and designated as a whole by the reference number 100 is a portion of a non-volatile memory device, in particular of a PCM type, limitedly to just the parts necessary for an understanding of the present disclosure.

Elements of the memory device 100 already described with reference to FIG. 1 are not described any further here and are designated by the same reference numbers.

The non-volatile memory device 100 comprises a memory array 102, constituted by a plurality of first memory cells 3 and by a plurality of second memory cells 3', which can be selected by local wordlines WL and local bitlines BL. In a way in itself known, the second memory cells 3' correspond, in number and manufacturing characteristics, to the first memory cells 3 and, in use, store a logic datum complementary to that of the first memory cells 3. The second memory cells 3' are queried during double-ended reading of the first memory cells 3 to read the logic datum stored in the first memory cells 3 by comparison with the logic datum stored in respective second memory cells 3'.

The local bitlines $BL_L< >$ and the first memory cells 3 form a first memory portion 102a. The local bitlines $BL_R< >$ and the second memory cells 3' form a second memory portion 102b.

The memory array 102 is organized in at least a first sector S101 and a second sector S102. Each sector comprises respective local bitlines BL< > (direct bitlines $BL_L< >$, and complementary bitlines $BL_R< >$), which can be addressed by a local column decoder 5 for each sector. The local bitlines BL< > of the sector S101 can be addressed via an even address number (S101 is therefore also referred to as "even sector"), and the local bitlines BL< > of the sector S102 can be addressed via an odd address number (S102 is therefore also referred to as "odd sector").

Given the matrix structure, activation of a local wordline WL< > and of a local bitline $BL_{L,R}< >$ enables unique selection of only one memory cell 3, 3'.

The reading stage 7 corresponds to what has already been described with reference to FIG. 1. The reading stage 7 is coupled to the local bitlines $BL_{L,R}< >$ by main bitlines $MBL_L< >$ (for the portion 2a) and main bitlines $MBL_R< >$ (for the portion 2b).

The global column decoder 4 corresponds to what has already been described with reference to FIG. 1 and is adapted to select the main bitline to which the memory cell 3, 3' to be addressed is coupled.

Here, a first main bitline $MBL_L<0>$, belonging to the memory portion 2a, connects the local bitlines $BL_L< >$ of the sector S101 to the global column decoder 4 and, via the latter, to the reading stage 7. The first main bitline $MBL_L<0>$ is connected to a node A common to all the local bitlines $BL_L< >$ belonging to the sector S101 in the first memory portion 2a (direct cells). As regards the global column decoder 4, both of the main selection switches 12a and 12d have a respective terminal connected to the first main bitline $MBL_L<0>$. In other words, the first main bitline $MBL_L<0>$ extends between the node A and a node A', from which there branch off the connections towards the respective terminals of the main selection switches 12a and 12d. The other terminal of the main selection switch 12a is connected to the first input 6a' of the sense amplifier 6a. The other terminal of the main selection switch 12d is, instead, connected to the first input 6b' of the sense amplifier 6b.

A second main bitline $MBL_L<1>$, belonging to the memory portion 2a, connects the local bitlines $BL_L< >$ of the second sector S102 to the global column decoder 4 and, via the latter, to the reading stage 7. The second main bitline $MBL_L<1>$ is connected to a node B common to all the local bitlines $BL_L< >$ belonging to the sector S102 in the first memory portion 2a (direct cells). As regards the global column decoder 4, both of the main selection switches 12b and 12c have a respective terminal connected to the second main bitline $MBL_L<1>$. In other words, the second main bitline $MBL_L<1>$ extends between the node B and a node B', from which there branch off the connections towards the respective terminals of the main selection switches 12b and 12c. The other terminal of the main selection switch 12b is connected to the first input 6a' of the sense amplifier 6a. The other terminal of the main selection switch 12c is, instead, connected to the first input 6b' of the sense amplifier 6b.

The memory portion 2b (complementary cells) is organized in a way similar to the memory portion 2a of the direct cells, as described hereinafter.

There is thus present a third main bitline $MBL_R<0>$, belonging to the memory portion 2b, which connects the local bitlines $BL_R< >$ of the first sector S101 to the global column decoder 4 and, via the latter, to the reading stage 7. In detail, the third main bitline $MBL_R<0>$ is connected to a node E common to all the local bitlines $BL_R< >$ belonging to the sector S101 in the second memory portion 2b (complementary cells). As regards the global column decoder 4, both of the main selection switches 12e and 12h have a respective terminal connected to the third main bitline MBL$_R$<0>. In other words, the third main bitline MBL$_R$<0> extends between the node E and a node E', from which there branch off the connections towards the respective terminals of the main selection switches 12e and 12h. The other terminal of the main selection switch 12e is connected to the second input 6a" of the sense amplifier 6a. The other terminal of the main selection switch 12h is, instead, connected to the second input 6b" of the sense amplifier 6b.

A fourth main bitline MBL$_R$<1>, belonging to the memory portion 2b, connects the local bitlines BL$_R$< > of the second sector S102 to the global column decoder 4 and, via the latter, to the reading stage 7. In detail, the fourth main bitline MBL$_R$<1> is connected to a node G common to all the local bitlines BL$_R$< > belonging to the sector S102 in the second memory portion 2b (complementary cells). As regards the global column decoder 4, both of the main selection switches 12g and 12f have a respective terminal connected to the fourth main bitline MBL$_R$<1>. In other words, the fourth main bitline MBL$_R$<1> extends between the node G and a node G', from which there branch off the connections towards the respective terminals of the main selection switches 12f and 12g. The other terminal of the main selection switch 12f is connected to the second input 6a" of the sense amplifier 6a. The other terminal of the main selection switch 12g is, instead, connected to the second input 6b" of the sense amplifier 6b.

Each local bitline BL$_L$< > of the sector S101 of the first memory portion 2a is electrically coupled to the node A by a respective local selection switch 13a (here, a respective PMOS transistor). Likewise, each local bitline BL$_R$< > of the sector S101 of the second memory portion 2b is electrically coupled to the node E by a respective local selection switch 13b (in this example, a respective PMOS transistor).

Likewise, each local bitline BL$_L$< > of the sector S102 of the first memory portion 2a is electrically coupled to the node B by a respective local selection switch 13a (here, a respective PMOS transistor). Likewise, each local bitline BL$_R$< > of the sector S102 of the second memory portion 2b is electrically coupled to the node G by a respective local selection switch 13b (here, a respective PMOS transistor).

The local selection switches 13a, 13b form part of the respective local column decoders 5. In use, the local column decoder 5 receives at input address-selection signals (DAS) S$_{YO}$< >, as already described with reference to FIG. 1 and therefore not described any further here.

As described with reference to FIG. 1, also in this case the sense amplifier 6a is coupled to a subset of bitlines BL< > referred to as even bitlines (i.e., indexed by an even index, such as BL<0>, BL<2>, BL<4>, etc.) belonging to the sector 101, while the sense amplifier 6b is coupled to a subset of bitlines BL< > referred to as odd bitlines (i.e., indexed by an odd index, such as BL<1>, BL<3>, BL<5>, etc.). The double-ended reading operation is carried out simultaneously by the sense amplifier 6a and 6b for the respective memory cells 3, 3' coupled, respectively, to the even and odd bitlines BL< >. The double-ended reading operation is carried out in accordance with the prior art, and is described by way of example hereinafter with reference to FIG. 6.

As regards reading in single-ended mode, the memory device 100 further comprises a first reference branch 20, which includes the reference generator 21, configured to generate the reference current i$_{REF}$ to be supplied to the second input 6a" of the sense amplifier 6a by the selection switch 22. The memory device 100 further comprises a second reference branch 23, which includes the reference generator 24, configured to generate a reference current i$_{REF}$, and is electrically coupled to the second input 6b" of the sense amplifier 6b by the selection switch 25.

During use of the memory device 100 in single-ended reading mode, the reference generators 21, 24 are on, and reading is performed by comparing the current that flows in the memory cell selected with the reference current i$_{REF}$.

In this reading mode, in order to maintain a same capacitive load on both of the inputs of the sense amplifiers 6a, 6b, the global column decoder 4 is controlled so as to connect the second inputs 6a", 6b" of the sense amplifiers 6a, 6b to a respective main bitline MBL$_R$< > belonging to the memory portion 2b.

In this embodiment, however, simultaneous reading of the even sector S101 and of the odd sector S102 is not possible, in so far as there would cease to be a de-selected sector to be used for capacitive matching.

Consequently, to read a datum from a memory cell 3 of the sector S101, the sector S102 is de-selected (i.e., no wordline of the sector S102 is selected), and the selection switches 12b-12d, 12e, 12g, 12h are switched off. The selection switches 12a, 12f are, instead, switched on. Reading is carried out by the sense amplifier 6a.

Figure 4:
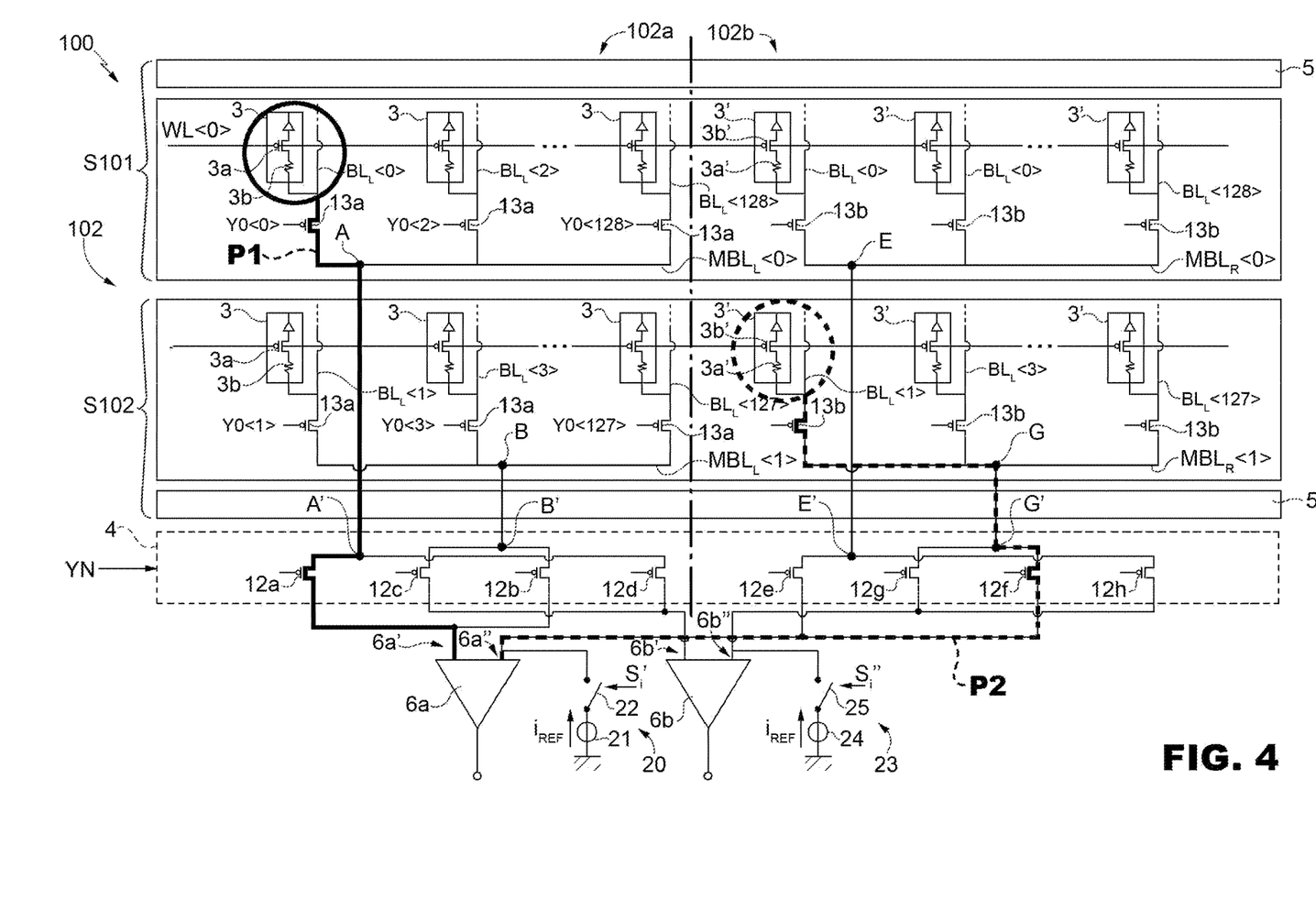
FIGS. 4-6 represent the memory device of FIG. 3 in respective operating conditions of the present invention.

As illustrated graphically in FIG. 4, reading of the logic datum stored in the memory cell 3 delimited by a dashed circle in the sector S101 is performed by connecting the memory cell 3 to the input 6a' of the sense amplifier 6a and enabling an electrical path between the memory cell 3 and the input 6a' (i.e., by selecting the corresponding wordline WL<0> by switching on the switch 13a of the bitline BL< > coupled to the memory cell 3 to be read and switching on the selection switch 12a). The path of the reading current is indicated in FIG. 4 with a thick solid line P1. The input 6a" receives the reference current i$_{REF}$ from the generator 21.

In order to provide at the input 6a" the required capacitive load, the input 6a" is connected to the main bitline MBL$_R$<1> via the switch 12f, which is switched on. Moreover, one of the switches 13b connected to the node G is also switched on, in particular the switch 13b for the bitline BL< > physically arranged so as to approximate as closely as possible the electrical path (and therefore the capacitive load) of the memory cell 3 to be read. Since all the wordlines WL< > of the sector S102 are de-selected, activation of the aforementioned electrical path does not generate a transfer of current towards the input 6a", but represents a capacitive load for the input 6a". The path that constitutes the capacitive load is indicated in FIG. 4 with a thick dashed line P2. It may be noted that, in this reading condition, the sense amplifier 6b is off and does not receive any datum/current signal at its inputs 6b', 6b".

Reading of a logic datum stored in a memory cell 3 of the sector S102 (odd sector) occurs in a way equivalent to what has been described with reference to FIG. 4. Also, in this case, simultaneous reading of the even sector S101 and of the odd sector S102 is not possible in so far as there would cease to be a de-selected sector to be used for capacitive matching.

Figure 5:
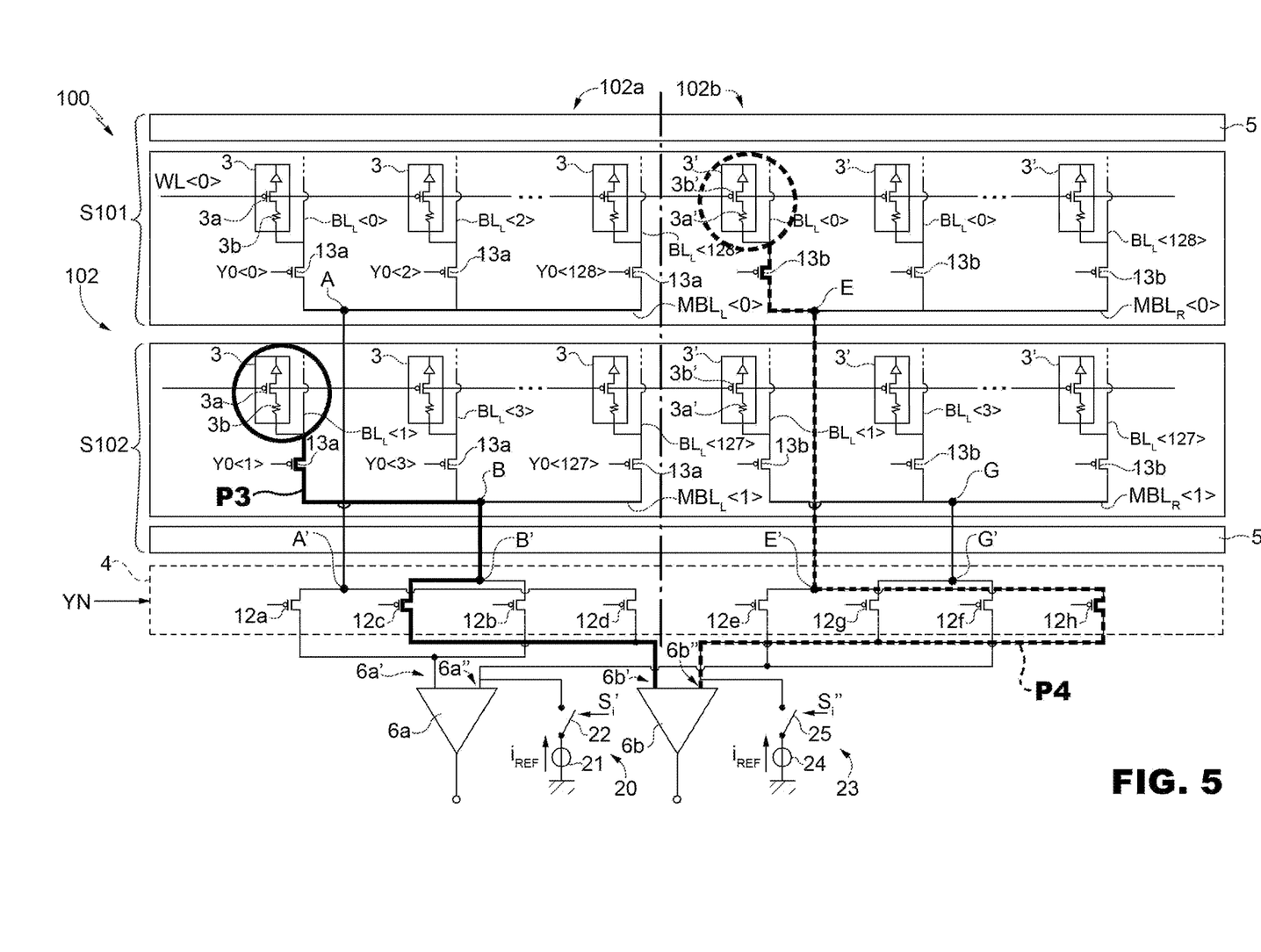

Consequently, to read a datum from a memory cell 3 of the sector S102, the sector S101 is de-selected (i.e., no wordline of the sector S101 is selected), and the selection switches 12a, 12b, 12d, 12e-12g are switched off. The selection switches 12c, 12h are instead switched on. Reading is carried out by the sense amplifier 6b.

As illustrated graphically in FIG. 5, reading of the logic datum stored in the memory cell 3 delimited by a dashed circle in the sector S102 occurs by connecting the memory cell 3 to the input 6b' of the sense amplifier 6b and enabling an electrical path between the memory cell 3 and the input 6b' (i.e., by selecting the corresponding wordline WL<> by switching on the switch 13a of the bitline BL<> coupled to the memory cell 3 to be read and switching on the selection switch 12c). The path of the reading current is indicated in FIG. 5 with a thick solid line P3. The input 6b" receives the reference current $i_{REF}$ from the generator 24.

In order to provide at the input 6b" the required capacitive load, the input 6b" is connected to the main bitline $MBL_R$<0> via the switch 12h, which is switched on. In addition, also one of the switches 13b connected to the node E is switched on, in particular the switch 13b for the bitline BL<> physically arranged so as to approximate as closely as possible the electrical path (and therefore the capacitive load) of the memory cell 3 to be read. Since all the wordlines WL<> of the sector S101 are de-selected, activation of the aforementioned electrical path does not generate a transfer of current towards the input 6b", but represents a capacitive load for the input 6b". The path that forms the capacitive load is indicated in FIG. 5 with a thick solid line P4. It may be noted that, in this reading condition, the sense amplifier 6a is off and does not receive any datum/current signal at its inputs 6a', 6a".

During use of the memory device 100 in double-ended reading mode, the reference generators 21, 24 are off. As regards the main selection switches, the double-ended reading mode envisages (FIG. 6) simultaneously switching on the selection switches 12a, 12c, 12e, 12g, and keeping the remaining switches 12b, 12d, 12f, 12h off.

Figure 6:
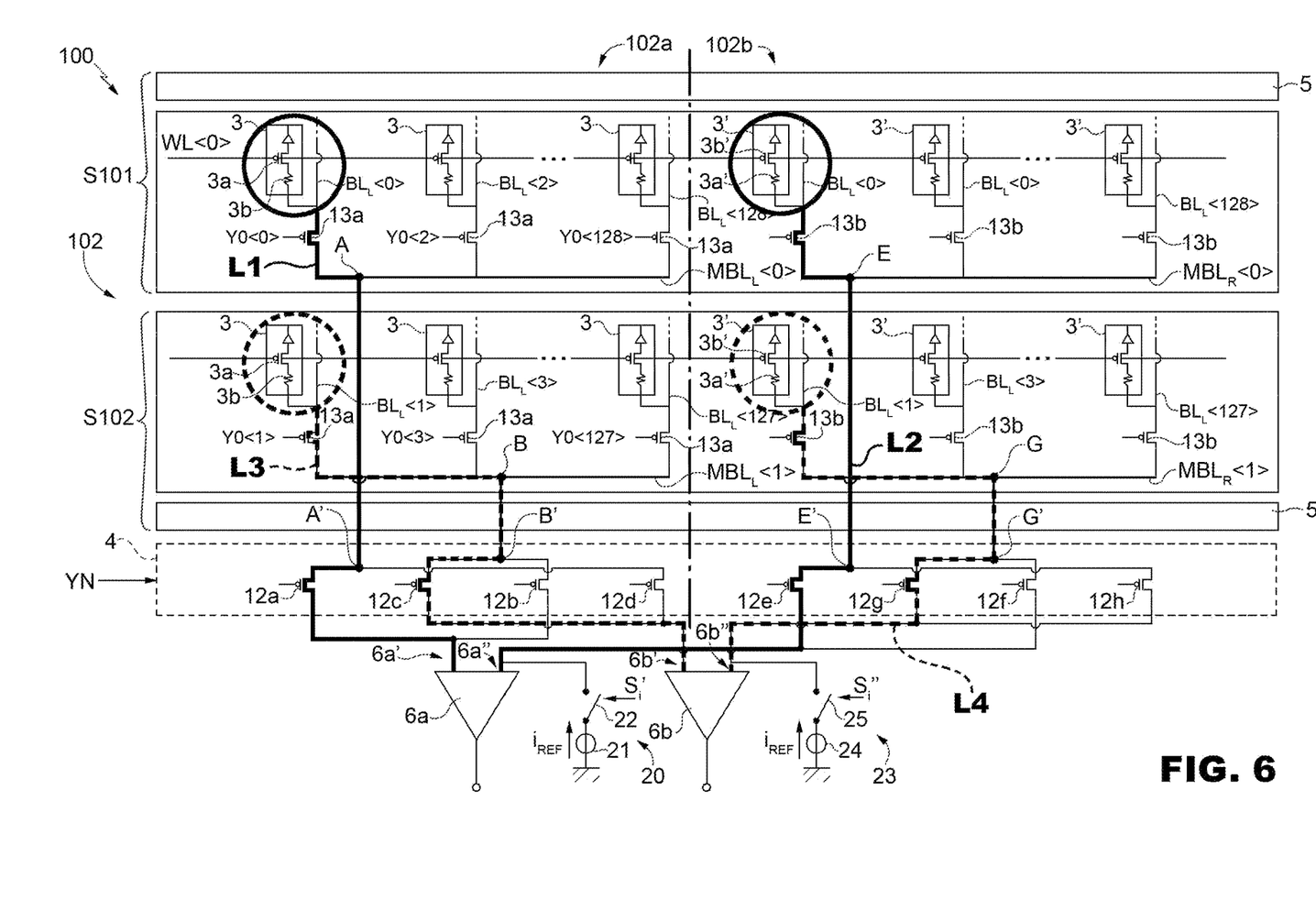

In this way, by selecting (activating) the appropriate wordlines WL<> in both of the sectors S101, S102 (in order to select the direct memory cell to be read and, simultaneously, the respective complementary memory cell), it is possible to set up the desired current paths towards: the input 6a' (path L1 in FIG. 6); the input 6a" (path L2 in FIG. 6); the input 6b' (path L3 in FIG. 6); and the input 6b" (path L4 in FIG. 6).

The operations of activation or selection of the main and local bitlines, as likewise of the wordlines, to implement the single-ended and double-ended reading operations according to the present invention are carried out by a controller appropriately configured for this purpose, in a way in itself evident to the person skilled in the art. The controller governs the selectors (switches, which are constituted, in particular, by transistors) described previously, sending signals for switching them on and for switching them off so as to create the appropriate electrical connections with the inputs of the sense amplifiers 6a, 6b. Buffers (not illustrated in detail) are typically present to adapt the level of the (voltage/current) signal to the level accepted at input by the control terminal (gate) of the selectors. A controller 201 is illustrated by way of example in FIG. 7.

Figure 7:
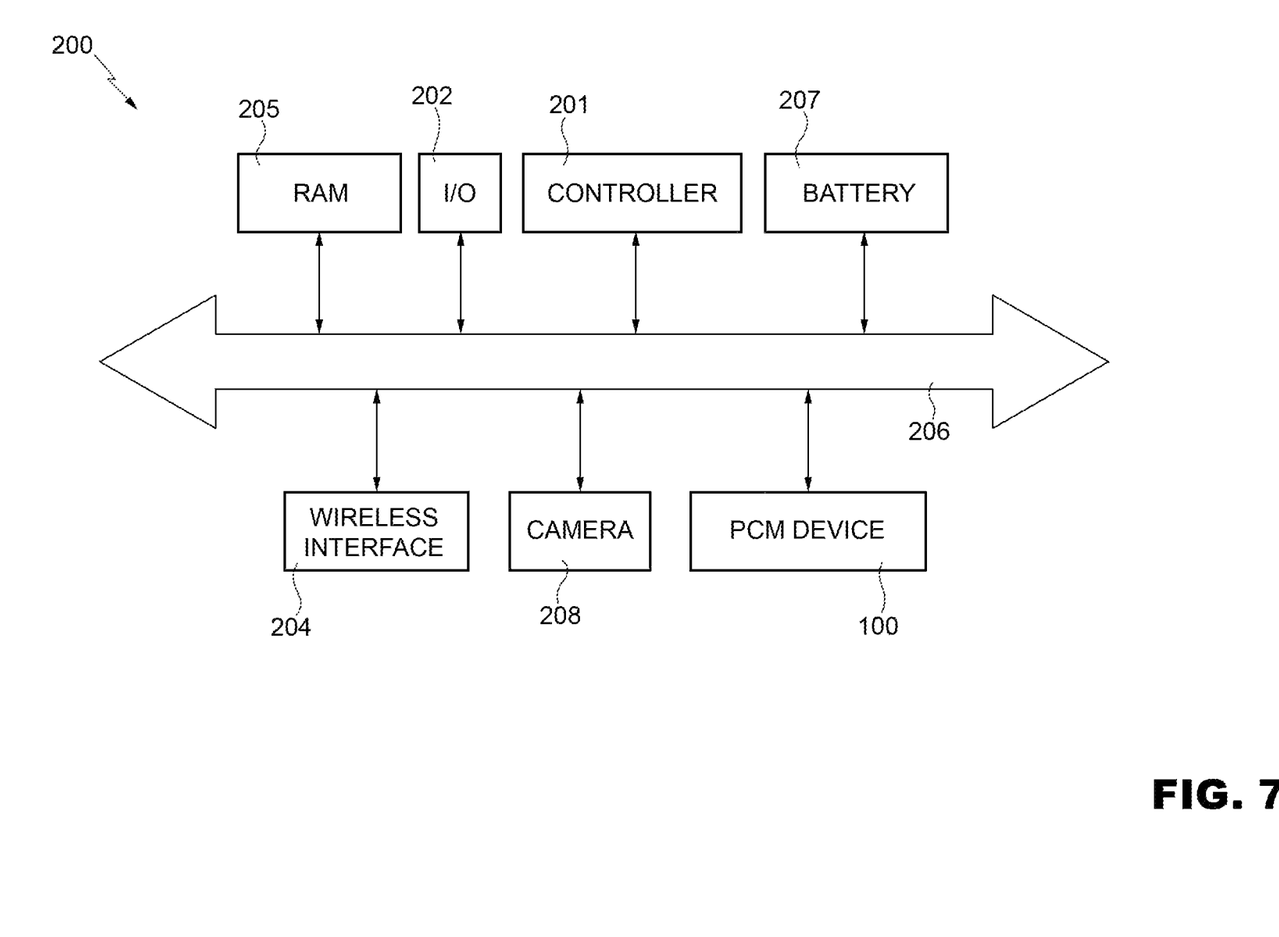
FIG. 7 is a simplified block diagram of an electronic system incorporating the non-volatile memory device, in an embodiment of the present invention.

FIG. 7 illustrates a portion of an electronic system 200, according to a further embodiment of the present invention. The electronic system 200 may be used in electronic devices, such as: a PDA (Personal Digital Assistant); a portable or fixed computer, possibly with the capacity of wireless data transfer; a mobile phone; a digital audio player; a photographic camera or video camera; or further devices capable of processing, storing, transmitting, and receiving information.

In detail, the electronic system 200 comprises a controller 201 (for example, provided with a microprocessor, a DSP, or a microcontroller), and the memory device 100, provided with the array of memory cells of the phase-change type, described previously. In addition, and optionally, the electronic system 200 further comprises one or more from among an input/output device 202 (for example, provided with a keypad and a display) for entering and displaying data, a wireless interface 204, for example an antenna, for transmitting and receiving data through a wireless communication radiofrequency network, and a RAM 205, all of which are coupled through a bus 206. A battery 207 can be used as electrical supply source in the electronic system 200, which may moreover be provided with a photographic camera or video camera 208.

From what has been described and illustrated previously, the advantages that the column decoder according to the invention affords are evident.

In particular, the silicon area required for providing a non-volatile memory (in particular, a PCM) operating as described and having the circuit structure described is minimized.

The architecture proposed moreover makes it possible to guarantee a good matching between the capacitive load and the inputs of the sense amplifier, both during single-ended reading and during double-ended reading.

Finally, it is clear that modifications and variations may be made to what has been described and illustrated herein, without thereby departing from the scope of the present invention, as defined in the annexed claims.

What has been described applies, in a similar way, to single-ended reading or double-ended reading of any other memory cell 3. What has been described likewise applies, in a similar way, to verification in single-ended reading mode of the memory cells 3', using a current reference supplied to the input 6a'/6b' of the sense amplifier 6a/6b.

It may be noted that, during single-ended reading of the sector S101 (memory portion 102a), the selection switches 13b of the sector S102 could be off, whereas for reading of a memory cell of the sector S102 those of the sector S101 could be off. In fact, the most important capacitive component in PCMs is represented by the main bitline (which is typically obtained in the form of a conductive metal path with a length of 2 mm and a width of 1 μm). Consequently, also by turning off the switches 13b, there would in any case be guaranteed a comparable capacitive load on both of the inputs of the sense amplifier involved in the reading process.

Moreover, the invention described and illustrated can be advantageously applied also to other types of memory devices, for example flash memory devices.

It is evident that a different number of selection switches may be provided in the column decoder, and a different organization thereof in hierarchical levels.

In addition, the present invention has been described with reference to just two sense amplifiers 6a, 6b. It is evident that a PCM device typically comprises a plurality of sense amplifiers higher than two (e.g., 128, 256, etc.), each dedicated to reading in parallel of respective data coming from memory cells 3 and 3' (in the case of double-ended reading), or from a memory cell 3 and from a current reference (in the case of single-ended reading).

Furthermore, one of the reference-current generators 21 and 24 may be omitted, and during single-ended reading the reference current $i_{REF}$ is supplied (alternatively) at the inputs 6a", 6b" by a single reference-current generator 21 or 24.

What is claimed is:

1. A phase-change memory device, comprising:
a memory array including a first sector having a first memory portion of direct memory cells, and a second sector having a second memory portion of direct memory cells;
a reading stage including a first sense amplifier configured to read a logic datum stored in a direct memory cell of the first sector, and a second sense amplifier configured to read a logic datum stored in a direct memory cell of the second sector;

a global column decoder functionally connected between the reading stage and the first and second sectors;

a first main bitline, having a first parasitic capacitance, which extends between the direct memory cells of the first sector and the global column decoder;

a second main bitline, having a second parasitic capacitance, which extends between the direct memory cells of the second sector and the global column decoder;

at least one reference-current generator coupled to the first and second sense amplifiers for supplying a reference reading current during a first operating mode of single-ended reading; and a controller configured to execute, in order to read the logic datum stored in the first sector during the first operating mode, the operations of:

selecting a direct memory cell to be read belonging to the first memory portion of the first sector;

connecting, via the global column decoder, the first main bitline to a first input of the first sense amplifier, thus coupling the first parasitic capacitance to the first input of the first sense amplifier and enabling a flow of current between the direct memory cell to be read in the first sector and the first input of the first sense amplifier; and connecting the reference-current generator to a second input of the first sense amplifier, thus enabling a flow of the reference reading current towards the second input of the first sense amplifier;

the controller being moreover configured to execute, in order to read the logic datum stored in the second sector during the first operating mode, the operations of:

selecting a direct memory cell to be read belonging to the second memory portion of the second sector;

connecting, via the global column decoder, the second main bitline to a first input of the second sense amplifier, thus coupling the second parasitic capacitance to the first input of the second sense amplifier and enabling a flow of current between the direct memory cell to be read in the second sector and the first input of the second sense amplifier; and connecting the reference-current generator to a second input of the second sense amplifier, thus enabling a flow of the reference reading current towards the second input of the second sense amplifier.

2. The memory device according to claim 1, wherein each memory portion of direct memory cells of the first and second sectors is provided with a plurality of first local bitlines connected to the corresponding direct memory cells;

the first main bitline extending at least in part between a first electrical node common to all the first local bitlines of the first sector and a second electrical node; and the second main bitline extending at least in part between a third electrical node common to all the first local bitlines of the second sector and a fourth electrical node; and wherein the global column decoder comprises a plurality of selection switches, amongst which:

a first selection switch is coupled between the second electrical node and the first input of the first sense amplifier;

a second selection switch is coupled between the second electrical node and the first input of the second sense amplifier;

a third selection switch is coupled between the fourth electrical node and the first input of the second sense amplifier; and a fourth selection switch is coupled between the fourth electrical node and the first input of the first sense amplifier.

3. The memory device according to claim 2, wherein, to read the logic datum stored in the first sector during the first operating mode, the controller is configured to:

switch on the first selection switch to connect the first main bitline to the first input of the first sense amplifier; and switch off the second, third, and fourth selection switches.

4. The memory device according to claim 3, wherein, to read the logic datum stored in the second sector during the first operating mode, the controller is configured to:

switch on the third selection switch to connect the second main bitline to the first input of the second sense amplifier; and switch off the first, second, and fourth selection switches.

5. The memory device according to claim 2, wherein the at least one reference-current generator comprises first and second reference-current generators, and wherein the memory device further comprises:

a fifth selection switch coupled between the first reference-current generator and the second input of the first sense amplifier; and a sixth selection switch coupled between the second reference-current generator and the second input of the second sense amplifier.

6. The memory device according to claim 2, wherein each of the direct memory cells comprises:

a phase-change region, which is electrically connectable to one of the first local bitlines; and a local selection transistor, which is operatively coupled to the phase-change region and has a control terminal connected to a respective wordline; and wherein the steps of selecting the direct memory cell to be read include switching on the respective local selection transistor via the respective wordline.

7. The memory device according to claim 1, wherein the first operating mode is a mode of verification or testing of the logic datum stored in the memory cells of the first and second sectors.

8. An electronic system comprising:

a system controller; and a phase-change memory device coupled to the system controller, the phase-change memory device comprising:

a memory array including a first sector having a first memory portion of direct memory cells, and a second sector having a second memory portion of direct memory cells;

a reading stage including a first sense amplifier configured to read a logic datum stored in a direct memory cell of the first sector, and a second sense amplifier configured to read a logic datum stored in a direct memory cell of the second sector;

a global column decoder functionally connected between the reading stage and the first and second sectors;

a first main bitline, having a first parasitic capacitance, which extends between the direct memory cells of the first sector and the global column decoder;

a second main bitline, having a second parasitic capacitance, which extends between the direct memory cells of the second sector and the global column decoder;
at least one reference-current generator coupled to the first and second sense amplifiers for supplying a reference reading current during a first operating mode of single-ended reading; and
a memory controller configured to execute, in order to read a logic datum stored in the first sector during the first operating mode, the operations of:
 selecting a direct memory cell to be read belonging to the first memory portion of the first sector;
 connecting, via the global column decoder, the first main bitline to a first input of the first sense amplifier, thus coupling the first parasitic capacitance to the first input of the first sense amplifier and enabling a flow of current between the direct memory cell to be read in the first sector and the first input of the first sense amplifier;
 connecting the reference-current generator to a second input of the first sense amplifier, thus enabling a flow of the reference reading current towards the second input of the first sense amplifier; and
the memory controller being moreover configured to execute, in order to read a logic datum stored in the second sector during the first operating mode, the operations of:
 selecting a direct memory cell to be read belonging to the second memory portion of the second sector;
 connecting, via the global column decoder, the second main bitline to a first input of the second sense amplifier, thus coupling the second parasitic capacitance to the first input of the second sense amplifier and enabling a flow of current between the direct memory cell to be read in the second sector and the first input of the second sense amplifier; and
 connecting the reference-current generator to a second input of the second sense amplifier, thus enabling a flow of the reference reading current towards the second input of the second sense amplifier.

9. The electronic system according to claim 8, further comprising one or more of the following coupled to the system controller:
 an input/output device;
 a wireless interface;
 a random access memory;
 a bus;
 a battery; or
 a camera.

10. The electronic system according to claim 8,
wherein each memory portion of direct memory cells of the first and second sectors is provided with a plurality of first local bitlines connected to the corresponding direct memory cells;
 the first main bitline extending at least in part between a first electrical node common to all the first local bitlines of the first sector and a second electrical node; and
 the second main bitline extending at least in part between a third electrical node common to all the first local bitlines of the second sector and a fourth electrical node; and wherein the global column decoder comprises a plurality of selection switches, amongst which:
 a first selection switch is coupled between the second electrical node and the first input of the first sense amplifier;
 a second selection switch is coupled between the second electrical node and the first input of the second sense amplifier;
 a third selection switch is coupled between the fourth electrical node and the first input of the second sense amplifier; and
 a fourth selection switch is coupled between the fourth electrical node and the first input of the first sense amplifier.

11. The electronic system according to claim 10, wherein, to read the logic datum stored in the first sector during the first operating mode, the memory controller is configured to:
 switch on the first selection switch to connect the first main bitline to the first input of the first sense amplifier; and
 switch off the second, third, and fourth selection switches.

12. The electronic system according to claim 11, wherein, to read the logic datum stored in the second sector during the first operating mode, the memory controller is configured to:
 switch on the third selection switch to connect the second main bitline to the first input of the second sense amplifier; and
 switch off the first, second, and fourth selection switches.

13. The electronic system according to claim 10, wherein the at least one reference-current generator comprises first and second reference-current generators, and wherein the memory device further comprises:
 a fifth selection switch coupled between the first reference-current generator and the second input of the first sense amplifier; and
 a sixth selection switch coupled between the second reference-current generator and the second input of the second sense amplifier.

14. The electronic system according to claim 10,
wherein each of the direct memory cells comprises:
 a phase-change region, which is electrically connectable to one of the first local bitlines; and
 a local selection transistor, which is operatively coupled to the phase-change region and has a control terminal connected to a respective wordline; and
wherein the steps of selecting the direct memory cell to be read include switching on the respective local selection transistor via the respective wordline.

15. The electronic system according to claim 8, wherein the first operating mode is a mode of verification or testing of the logic datum stored in the memory cells of the first and second sectors.

16. A method for read decoding of a phase-change memory device that comprises a memory array including a first sector having a first memory portion of direct memory cells; a second sector having a second memory portion of direct memory cells; a reading stage including a first sense amplifier configured to read a logic datum stored in a direct memory cell of the first sector, and a second sense amplifier configured to read a logic datum stored in a direct memory cell of the second sector; a global column decoder functionally connected between the reading stage and the first and second sectors; a first main bitline, having a first parasitic capacitance, which extends between the direct memory cells of the first sector and the global column decoder; a second main bitline, having a second parasitic capacitance, which extends between the direct memory cells of the second sector and the global column decoder; and at least one reference-current generator coupled to the first and second sense amplifiers for supplying a reference reading current during a first operating mode, the method comprising:

during reading the logic datum stored in the first sector:
selecting a direct memory cell to be read belonging to the first memory portion of the first sector;
connecting, via the global column decoder, the first main bitline to a first input of the first sense amplifier; and
connecting the reference-current generator to a second input of the first sense amplifier; and during reading the logic datum stored in the second sector:
selecting a direct memory cell to be read belonging to the second memory portion of the second sector;
connecting, via the global column decoder, the second main bitline to a first input of the second sense amplifier; and
connecting the reference-current generator to a second input of the second sense amplifier.

17. The method according to claim 16, wherein each memory portion of direct memory cells of the first and second sectors is provided with a plurality of first local bitlines connected to the corresponding direct memory cells, the first main bitline extending at least in part between a first electrical node common to all the first local bitlines of the first sector and a second electrical node, and the second main bitline extending at least in part between a third electrical node common to all the first local bitlines of the second sector and a fourth electrical node; wherein the global column decoder comprises a plurality of selection switches, amongst which a first selection switch is coupled between the second electrical node and the first input of the first sense amplifier, a second selection switch is coupled between the second electrical node and the first input of the second sense amplifier, a third selection switch is coupled between the fourth electrical node and the first input of the second sense amplifier, and a fourth selection switch is coupled between the fourth electrical node and the first input of the first sense amplifier, the method further comprising:

during the reading the logic datum stored in the first sector:
switching on the first selection switch to connect the first main bitline to the first input of the first sense amplifier; and
switching off the second, third, and fourth selection switches.

18. The method according to claim 17, further comprising, during the reading the logic datum stored in the second sector:
switching on the third selection switch to connect the second main bitline to the first input of the second sense amplifier; and
switching off the first, second, and fourth selection switches.

19. The method according to claim 16,
wherein each memory portion of direct memory cells of the first and second sectors is provided with a plurality of first local bitlines connected to the corresponding direct memory cells;
wherein each of the direct memory cells of the first and second sectors comprises:
a phase-change region, which is electrically connectable to one of the first local bitlines; and
a local selection transistor, operatively coupled to the phase-change region and having a control terminal connected to a respective wordline; and
wherein the steps of selecting the direct memory cell to be read include switching on the respective local selection transistor via the respective wordline.

20. The method according to claim 16, wherein the first operating mode is a mode of verification or testing of the logic datum stored in the memory cells of the first and second sectors.

* * * * *